United States Patent [19]
Duffar et al.

[11] Patent Number: 6,090,201
[45] Date of Patent: Jul. 18, 2000

[54] PISTON-ACTIVATED CRYSTAL-GROWING APPARATUS

[75] Inventors: Thierry Duffar, Grenoble; Pierre Dusserre, St. Egreve, both of France

[73] Assignee: Commissariat a l'Energie Atomique, Paris, France

[21] Appl. No.: 09/053,786

[22] Filed: Apr. 2, 1998

[30] Foreign Application Priority Data

Apr. 9, 1997 [FR] France .................................. 97 04347

[51] Int. Cl.$^7$ .................................................. C30B 35/00
[52] U.S. Cl. .............................. 117/200; 117/81; 117/83; 117/206
[58] Field of Search ................................. 117/81, 82, 83, 117/200, 206, 204; 422/245.1, 254

[56] References Cited

U.S. PATENT DOCUMENTS 4,167,554   9/1979   Fisher ....................................... 117/208

OTHER PUBLICATIONS

Patent Abstracts of Japan vol. 15, No. 456 (C–886), 20, Nov. 1991, and Japan 03 193689 A (Hitachi Cable Ltd), Aug. 23, 1991.

Patent Abstracts of Japan vol. 12, No. 316 (C–524), Aug. 26, 1988, and Japan 63 085082 A (Nippon Telegraph and Telephone Corporation).

WO 91 02832 A (Ostrogorsky).

Journal of Crystal Growth, vol. 137, 1994, Amsterdam NL, pp. 64–71, XPOOO480880, Ostrogorsky et al.: "Normal and Zone Solidification Using the Submerged Heater Method".

"Material Synthesis and Crystal Growth of HTC Ceramics and Single Crystals Under High Pressure"; Morawski, et al; Appl. Supercond. (1993), 1(3–6), pp. 599–606. (Abstract only 1993.

*Primary Examiner*—Felisa Hiteshew
*Attorney, Agent, or Firm*—Burns, Doane, Swecker & Mathis, LLP

[57]   ABSTRACT

A piston-activated crystal-growing apparatus includes a crucible for containing a seed and a solidifiable liquid covering the seed. In operation, thermal gradient is established in the crucible, and a piston moves within the crucible in the direction of the crystal.

8 Claims, 2 Drawing Sheets

PISTON-ACTIVATED CRYSTAL-GROWING APPARATUS

DESCRIPTION

1. Field of the Invention

The present invention relates to a piston-activated crystal-growing apparatus. More precisely, the apparatus is designed for growing single-axis crystals in a crucible.

The invention has applications in the field of industrial crystal growing, mainly for forming semiconductor crystals that require a high level of chemical uniformity. The invention may be used, for example, for growing crystals made of III–V materials such as GaAs, InP, GaSb, InSb, etc. or II–VI materials such as CdTe, HgTe, etc. and their ternary alloys. Generally speaking, the invention may be applied to all metal alloys and refractories that can be produced in a crucible.

2. Discussion of the Relevant Art

Techniques for forming monodirectional crystals in crucibles are well known in the prior art. The Bridgman and "Gradient Freeze" methods are particularly common.

A crystallization procedure that aims to improve the quality of crystals obtained by these standard methods is known and described in document WO 91/02832. The procedure described is normally implemented using a crucible. A solid seed of semi-conductor material is placed in the crucible and covered in the liquid form of the same material for solidification. The sold germ correctly initiates growth of the crystal.

A heating element is immersed in the liquid covering the seed and used to establish a thermal gradient in the crucible. The thermal gradient causes the liquid to solidify, starting with the seed, to form the crystal.

The solidification process causes displacement of the upper surface of the crystal towards the top of the crucible. This surface will be referred to as the "solid/liquid interface" in the rest of the present description.

In order to produce a uniform crystal the heating element must be kept at a constant distance from the solid/liquid interface during the crystallization process. Mechanical means are therefore provided to move the heating element in the direction of formation of the crystal.

An improvement on this method was described in an article by Ostrogorsky, A. and Muller, G. published in the "Journal of Crystal Growth", No. 137 (1994), pp. 64–71.

In this improvement the heating element immersed in the liquid to be solidified is replaced by a simple piston that moves within the crucible and is displaced such that it remains at a constant distance from the solid/liquid interface as the crystal forms. The crucible is placed in a crystal-growing kiln capable of providing the thermal gradient required for the formation of crystals. The piston is immersed in the liquid and fitted with a thermocouple device to measure the temperature of the liquid. Measuring this temperature, which is dependent on the position of the piston in the crucible, makes it possible to determine whether the piston is approaching the solid/liquid interface (the temperature drops) or drawing away from it (the temperature rises).

The displacement of the piston, which is controlled by relatively complex means, is therefore slaved to the temperature measured.

This type of piston-activated crystallization method produces crystals that are more uniform than those grown using standard techniques without the use of the piston.

However, the method has several drawbacks. In particular, it uses complex mechanical means and an expensive thermocouple apparatus. Moreover, the thermocouple may be sensitive to variations in the temperature of the kiln, thereby falsifying information about the displacement of the solid/liquid interface.

There are also problems of contamination of the liquid to be solidified during the crystal-growing process in this apparatus of the prior art.

DISCLOSURE OF THE INVENTION

The present invention aims to overcome these drawbacks by proposing a simple, low-cost apparatus that can be used to grow crystals with a high degree of uniformity.

One aim of the invention is to produce an apparatus in which the piston is maintained at a constant distance from the growing seed without measuring the temperature in the piston.

A further aim of the invention is to produce a piston-activated crystal-growing apparatus that eliminates contamination of the liquid that is to be solidified.

More explicitly, the invention relates to a piston-activated crystal-growing apparatus comprising:

a crucible capable of containing a seed and a liquid to be solidified covering the seed, means for establishing a thermal gradient in the crucible, a piston that moves inside the crucible in the direction of growth of the crystal.

According to the invention the apparatus comprises means for displacing the piston that are activated by the liquid to be solidified.

The operation of this type of apparatus is essentially based on the property of semiconductors to dilate or contract during the crystallization process. For the purposes of the present invention "dilation" is understood to mean the property of certain semiconductors that enables their volume in the solid state to be greater than that in the liquid state. To simplify the rest of this description the term "dilation" will be used to designate this property.

Furthermore, for the purposes of the present invention the term "contraction" is understood to mean the property of certain semiconductors that enables their volume in the solid state to be less than that in the liquid state. Again to simplify the rest of this description the term "contraction" will be used to designate this property.

We would point out that the ratio between the solid volume and the liquid volume is known or experimentally determined for any given semiconductor.

The variation in the volume of a semiconductor material during crystallization causes displacement of the level of the liquid as the crystal grows, i.e. as the solid/liquid interface rises in the crucible.

The invention proposes to use this movement of the level of the liquid to displace the piston. The invention makes means of measuring temperature superfluous.

The means for displacing the piston may advantageously comprise a floater connected to the piston and capable of floating on the liquid to be solidified.

Said floater reproduces the displacement of the level of liquid in the crucible as the crystal grows. This type of apparatus is simple and considerably cheaper than the temperature measuring means of the prior art.

In one embodiment of the invention the piston displacement means may comprise a piston rod that rigidly connects the piston to the floater.

The piston is therefore directly moved by the floater in the direction of its displacement. This type of apparatus is suitable for crystals that dilate since the liquid rises in the crucible, i.e. varies in the same direction as the solid/liquid interface. This arrangement has the advantage of being very simple to construct as it also requires no mechanical connection external to the crucible.

In this embodiment the upper section of the crucible may be narrowed. The liquid may enter this narrowed section, as may the end of the rod bearing the floater.

This characteristic causes greater variation in the level of the liquid in the narrowed section than in the rest of the crucible.

The diameter of said narrowed section is adapted to the diameter of the crucible and to the ratio between the solid and liquid forms of the crystal. The displacement of the liquid in the narrowed section is therefore proportional to the displacement of the solid/liquid interface in the crucible. The piston, activated by the floater, therefore moves at the displacement speed of the solid/liquid interface and is held at a constant distance from it.

Additional means may be advantageously provided to heat this upper section to prevent the liquid in the narrowed section from solidifying.

In another embodiment the piston displacement means may comprise movement transmission means connecting the floater to the piston. Said movement transmission means may comprise a first rack constructed as part of the floater, a second rack constructed as part of the piston, and a toothed gear system that meshes with the first and second racks.

This type of easily-implemented mechanism has the advantage of also being suitable for use with contracting crystals. In this case the level of the liquid in the crucible drops as the crystal grows. The floater is therefore displaced in the opposite direction to that of the solid/liquid interface. The geared system of the invention causes the floater to move the piston in the direction of the solid/liquid interface. The diameter of the toothed gears is adapted so that the displacement speed is proportional to that of the solid/liquid interface.

Advantageously, the crucible may be constructed as a leaktight container. This is made possible by the considerable simplification of the displacement means used in the invention. It is thereby possible to eliminate any outside contamination of the liquid to be solidified or the crystal formed from it.

Other characteristics and advantages of the present invention will be better understood from the following description. The description is of embodiments given as non-limitative examples and refers to the attached figures.

DISCLOSURE OF PREFERRED EMBODIMENTS

Figure 1:
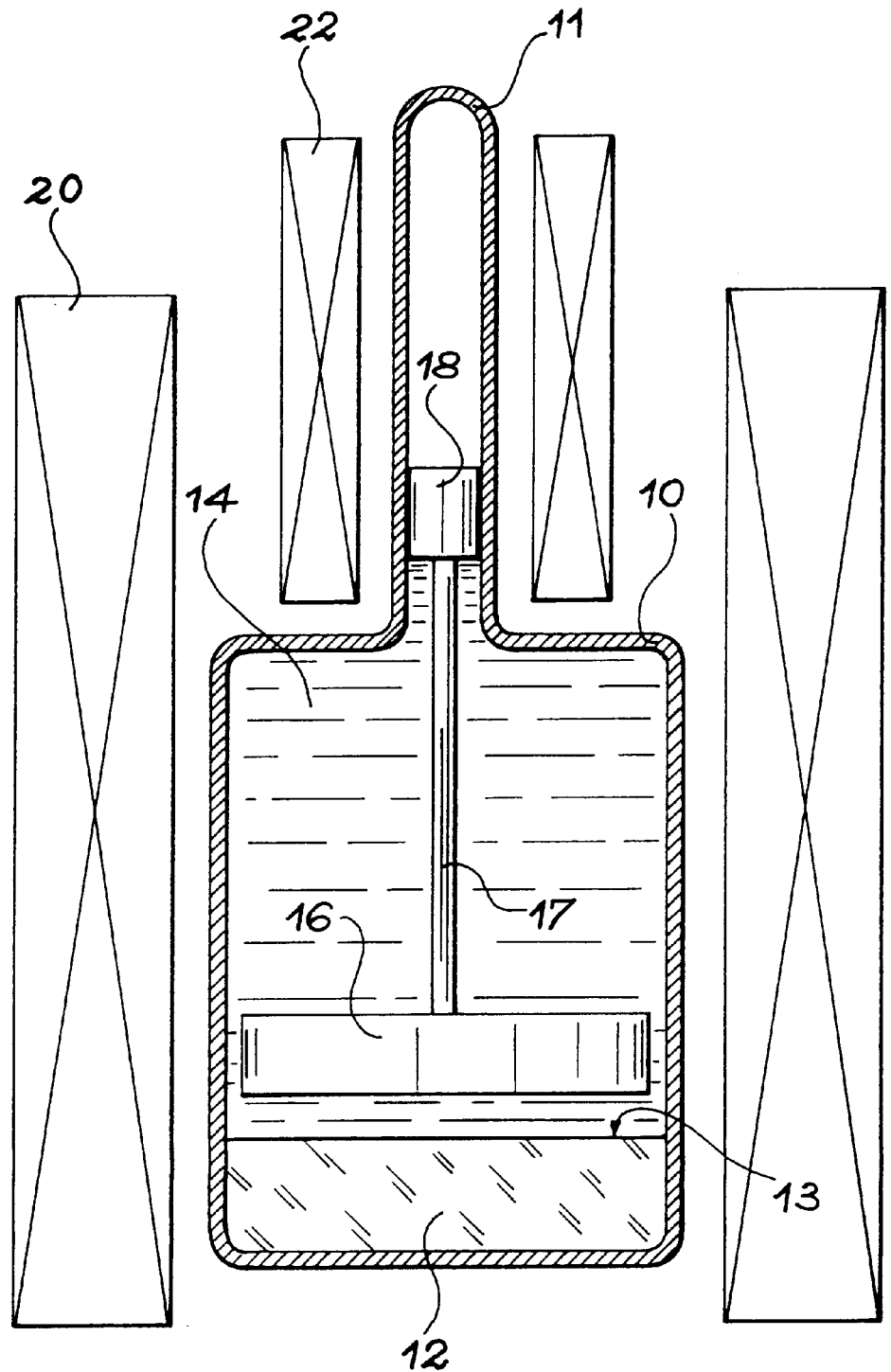
FIG. 1 shows a piston-activated crystal-growing apparatus constructed in a leaktight container according to a first embodiment of the invention.

The piston-activated crystal-growing apparatus shown in FIG. 1 comprises a crucible (10) in which is placed a seed crystal (12) designed to start growth, covered with liquid (14) of the same material to be solidified. A solid/liquid interface (13) divides the liquid section (14) from the solid section of the formed crystal.

The seed crystal (12) normally has the same diameter as the crucible.

A crystal is grown by placing the crucible (10) in a crystal-growing kiln (20) of which only the heating elements are shown. A thermal gradient is established in the crucible in order to solidify the liquid (14). Formation of the crystal causes the solid/liquid interface (13) to rise in the crucible.

The apparatus of the invention comprises a piston (16) immersed in the liquid (14). The piston (16) has an external diameter slightly less than that of the crucible to allow it to slide in the crucible without friction. The piston is held at a constant distance from the solid/liquid interface (13) so as to allow for uniform growth of the crystal.

In order to maintain the piston at a constant distance from the solid/liquid interface, and therefore displace the piston proportionally to the movement of the solid/liquid interface, the invention makes use of the characteristic of certain semiconductors to dilate (Si, Ge, GaSb, InSb, GaAs, etc. or contract (PbSe, PbTe, InTe) while they are forming. These characteristics respectively cause the rise or fall of the level of liquid (14) in the crucible. The apparatus of FIG. 1 is suitable for forming crystals that dilate.

This type of apparatus uses a floater (18) rigidly connected to piston (16) via a rod (17). The floater, which is made of a light material, for example graphite, is placed on the liquid (14) so that it floats without getting wet.

In the example shown in FIG. 1, the level of the liquid rises in the crucible during crystallization. The floater (18) also rises, moving the piston (16) to which it is rigidly connected.

Due to the dilation characteristics of the crystal being formed and the dimensions of the crucible, the displacement of the liquid level (14) is not necessarily proportional to that of the solid/liquid interface (13). To take account of this fact, the invention of FIG. 1 proposes a crucible (10) with a narrowed upper section (11) in which the liquid (14) and the floater (18) can rise. This section (11) of the crucible is adapted to the diameter of the crucible and to the ratio between the solid and liquid forms of the crystal. The piston is thus maintained at a constant distance from the solid/liquid interface (13). Additional heating means (22) may heat the narrowed section (11) of the crucible to prevent the liquid (14) rising in the narrowed section from solidifying.

It will be seen from FIG. 1 that the crucible (10) is constructed as a leaktight container. It is thus suitable for growing crystals sensitive to contamination by the gaseous phase such as, for example, CdTe, GaAs and HgTe since it eliminates any contamination during crystal growth.

Figure 2:
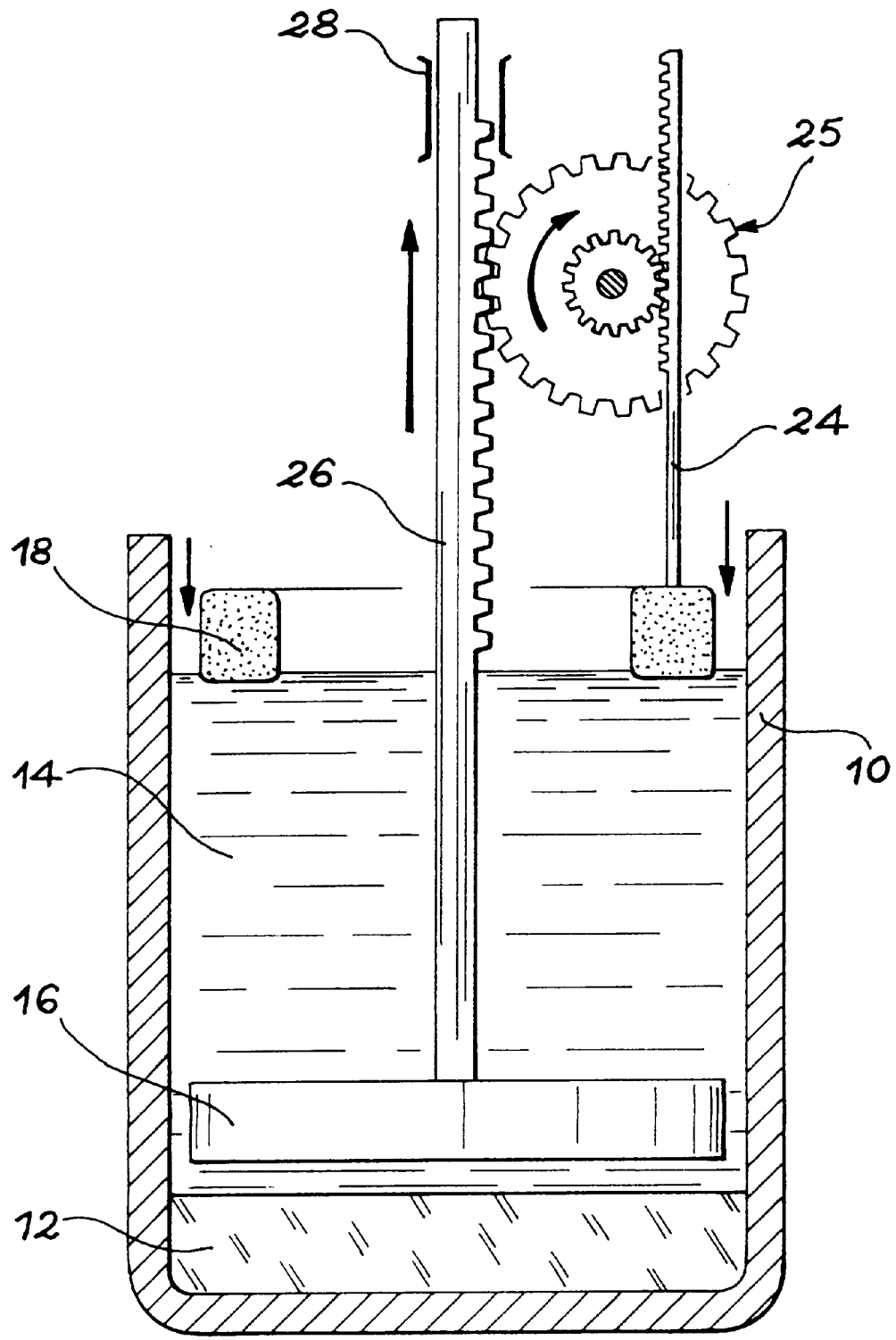
FIG. 2 shows a piston-activated crystal-growing apparatus according to a second embodiment of the invention.

FIG. 2 shows a second embodiment of the invention. Some components are common to the apparatus of FIG. 1: a crucible (10) containing a seed (12) covered by a liquid (14), a piston (16) and a floater (18).

The apparatus shown diagrammatically in this figure is suitable for growing crystals that contract. In this case the level of liquid in the crucible drops during crystal growth while the solid/liquid interface (16) rises. The floater is thus displaced in the opposite direction to that of the solid/liquid interface (13).

Mechanical means (24, 25, 26) connecting the floater to the piston are used to displace the piston (16) in the same direction as the solid/liquid interface (16).

Said mechanical means comprise a rack (24) constructed as part of the floater. The floater transmits the movement of the liquid (14) to a gear system (25) via the rack (24). The rack then drives the piston (16) via a rack (26) constructed as part of the piston.

The diameter of the toothed wheels of the gear system (25) is adapted to the diameter of the crucible and the ratio of the solid volume to the liquid volume so that the movement transmitted to the piston (16) is the same as that of the solid/liquid interface (13).

The vertical displacement of the piston may be maintained by a guide component (28).

A variant of this geared apparatus can be envisaged for dilating crystals. Adding a toothed wheel, for example, will activate the piston in the displacement direction of the floater. However, in this case the apparatus of FIG. 1 is simpler to implement and is therefore recommended.

We claim:

1. The piston-activated crystal-growing apparatus comprising:

a crucible (10) capable of containing a seed (12) and a liquid (14) to be solidified covering the seed (12), means (20) for establishing a thermal gradient in the crucible (10), a piston (16) that moves inside the crucible (10) in the direction of growth of the crystal, characterized by the fact that it also comprises:

means for displacing the piston that are activated by the liquid (14) to be solidified.

2. Apparatus of claim 1, characterized by the fact that the means for displacing the piston (16) comprise a floater (18) capable of floating on the liquid to be solidified (14) and connected to the piston (16).

3. Apparatus of claim 2, characterized by the fact that the displacement means also comprise a piston rod (17) that rigidly connects the piston (16) to the floater (18).

4. Apparatus of claim 3 in which the crucible (10) has a narrowed upper section (11) so that the liquid (14) may enter, as may the end of the rod (17) bearing the floater (18).

5. Apparatus of claim 4, characterized by the fact that it comprises additional heating means (22) disposed in the narrowed upper section (11) of the crucible (10).

6. Apparatus of claim 2, characterized by the fact that the piston displacement means comprise means for transmitting the movement connecting the floater (18) and the piston (16).

7. Apparatus of claim 6, characterized by the fact that the movement transmission means comprise:

a first rack (24) constructed as part of the floater (18), a second rack (26) constructed as part of the piston (16), and a toothed wheel gear system (25) that meshes with the first and second racks.

8. Apparatus of claim 1, characterized by the fact that the crucible (10) is a leaktight container.

* * * * *